United States Patent [19]

Ohba

[11] Patent Number: 5,232,872
[45] Date of Patent: Aug. 3, 1993

[54] METHOD FOR MANUFACTURING SEMICONDUCTOR DEVICE

[75] Inventor: Takayuki Ohba, Yokohama, Japan

[73] Assignee: Fujitsu Limited, Kanagawa, Japan

[21] Appl. No.: 845,549

[22] Filed: Mar. 5, 1992

Related U.S. Application Data

[63] Continuation of Ser. No. 518,634, May 2, 1990, abandoned.

[30] Foreign Application Priority Data

May 9, 1989 [JP] Japan ................... 1-117128
Mar. 9, 1990 [JP] Japan ................... 2-58918

[51] Int. Cl.$^5$ .......................................... H01L 21/44
[52] U.S. Cl. .................................. 437/192; 437/245; 437/246; 437/946; 148/DIG. 17
[58] Field of Search ............... 437/192, 946, 225, 245, 437/246; 148/DIG. 17

[56] References Cited

U.S. PATENT DOCUMENTS

| | | | |
|---|---|---|---|
| 4,428,796 | 1/1984 | Milgram | 156/637 |
| 4,701,349 | 10/1987 | Koyanagi et al. | 437/241 |
| 4,749,440 | 6/1988 | Blackwood et al. | 156/646 |
| 4,884,123 | 11/1989 | Dixit et al. | 437/192 |
| 4,897,709 | 1/1990 | Yokoyama et al. | 437/197 |
| 4,910,044 | 3/1990 | Yamazaki et al. | 427/54.1 |
| 4,987,008 | 1/1991 | Yamazaki et al. | 156/643 |

FOREIGN PATENT DOCUMENTS 0174743  3/1986  European Pat. Off. .

OTHER PUBLICATIONS

Bagratishvili; "Hydraulic Plasma Etching of Semiconductor Surfaces", Chemical Abstracts; vol. 100; 1984; p. 130841.

Primary Examiner—Brian E. Hearn
Assistant Examiner—Trung Dang
Attorney, Agent, or Firm—Nikaido, Marmelstein, Murray & Oram

[57] ABSTRACT

A method of forming metal contact wiring layers in semiconductor devices by cleaning the surface of an exposed substrate of a contact hole formed to the $SiO_2$ film on a semiconductor substrate with the reducing effect of $N_2H_4$ gas, thereafter forming a TiN barrier layer by the CVD method using the mixed gas of $N_2H_4$ and $TiCl_4$ while the surface is not exposed to the air, then forming a tungsten contact layer thereon by the CVD method using the mixed gas of $N_2H_4$ and $WF_6$, or forming the TiN layer by the CVD method on the tungsten contact layer formed by the CVD method on the substrate.

11 Claims, 10 Drawing Sheets

METHOD FOR MANUFACTURING SEMICONDUCTOR DEVICE

This application is a continuation of application Ser. No. 518,634 filed May 2, 1990 now abandoned.

BACKGROUND OF THE INVENTION

1. Field of the Invention

The present invention relates to a method for manufacturing semiconductor devices and particularly to a method for surface treatment and forming low contact resistance wirings.

Recently, with further improvement in high packing density of semiconductor devices, multilayer wirings are often used and moreover since the contacts of wirings are also microminiaturized, contact resistance increases.

Meanwhile, depth of p-n junction formed becomes shallow and thereby leakage current resulting from damage at the p-n junction in the contact area increases.

When contact resistance becomes larger up to a degree as cannot be neglected for channel resistance the leakage current, for channel current, since these factors have a large influence on operations of the device, reduction of contact resistance and leakage current is essential.

Moreover, flatness of the substrate is also essential for improving reliability of wirings such as stability of wirings for heat cycles.

2. Description of the related Art

In the case of forming contact layers of an aluminum system or refractory metal on a silicon substrate by the sputtering method or CVD method, it is known that the cleanliness of the substrate surface influences the contact resistance. For instance, when titanium(Ti) is formed on a Si substrate by the sputtering method, formation of silicide (TiSi$_x$) generated through the reaction of Ti and Si becomes non-uniform due to contamination of the Si surface (natural oxide, organic substances, etc). Contact resistance therefor becomes high. Moreover, when a tungsten (W) layer is grown by the CVD method, since nucleation is not smoothly formed on a natural oxide, the layer does not grow or the layer is grown with irregular corrosion.

Therefore, it is essential to keep the surface clean to form the contacts in order to attain a low contact resistance. As the surface treatment of the lower base layer, the wet etching method and dry etching method such as plasma etching method and hydrogen reduction method have been conducted. However, using a wet or dry etching method, side products may easily be generated and using the plasma etching method, damage occurs on the surfaces. Moreover, int he reduction by hydrogen, thermal damage occurs. The diffused layer is extended or the aluminum wirings are easily melted due to high temperature (800° C.) and as a result, the characteristics of the device may be lowered. As explained above, the best surface processing method has not yet been found.

In order to realize low contact resistance, refractory metal (for example, tungsten W or titanium Ti), silicide thereof (for example, WSi$_x$, TiSi$_x$) or nitride thereof (for example, WN. TiN) are used in place of aluminum (Al) which has been used most widely as the conventional wiring material. These materials simultaneously play the role of a barrier metal for interfering with chemical reactions between the substrate and the aluminum wirings. Even when the contact includes shallow junctions, a spike generated by the chemical reactions between the substrate materials and the wiring materials does not damage the shallow junctions. Therefore, this barrier metal effectively prevents leakage current caused by damage on the junction areas.

With regard to the contact metal layer, the method for sputtering the Al related material such as aluminum (Al), AlSi and AlCu has been used. However, in this case, there have been the disadvantages that AlSi allows an increase of the contact resistance by segregation of si and that defective wirings occur due to low migration resistance (electro migration or stress migration) of Al and Al alloy.

This migration problem has been solved by using the CVD method using tungsten W as the contact metal layer or wirings. Coverage of Al is improved by the burying method and defective wirings do not occur due to high migration resistance of wirings by tungsten W. However, this CVD method still provides a disadvantage that Si or fluorine F, which is an element of the reactant gas forming element, is easily incorporated in the tungsten W layer with a low temperature reducing reaction using silane (SiH$_4$), etc. As a result, contact resistance becomes larger and the coverage rate becomes smaller. On the other hand, the CVD of tungsten W using the reducing reaction of hydrogen (H$_2$) is characterized by providing a large coverage rate but is also accompanied by the disadvantage that corrosion of Si is distinctive and leak current is generated due to high growth temperature and generation of corrosive gas.

The tungsten W layer obtained by the CVD method provides a problems such as peeling of the layer due to having a bad adhesive property on the SiO$_2$ layer. Therefore, an adhesive layer which also works as a barrier layer of contact such as TiN is first formed by the sputtering method and a tungsten W layer is formed thereon also by the CVD method. However, this adhesive layer has bad coverage at the stepped portions due to use of the sputtering method and causes abnormal growth, zero growth or peeling of the tungsten layer at the contact regions.

Accordingly, is has long been expected that the optimum method for cleaning the surface of substrate had been found and a lower contact resistance can be obtained by forming wiring materials on the surface of base substrate.

Moreover, the most desirable method is to sequentially form the barrier metal layer and wiring materials within a series of processings including the surface treatment of base substrate.

SUMMARY OF INVENTION

It is an object of the present invention to obtain the contact regions of low contact resistance through the cleaning of a substrate surface.

It is another object of the present invention to obtain contact regions with less leakage current.

It is still another object of the present invention to obtain contact regions realizing flattening of the substrate surface.

It is further object of the present invention to obtain contact regions ensuring high reliability.

These objects may be attained by sequentially conducting and following a number of contact manufacturing methods (a), (b) as a series of processes:

(a) A contact manufacturing method in which a substrate surface is exposed to any one kind of gas of nitrogen hydride or organic nitrogen hydride and the surface is thereby cleaned.

(b) A contact and wiring manufacturing method in which a barrier metal layer is formed by the CVD method using a mixed gas, as the raw material, the gas consisting of metal halide or organic metal or metal complex and nitrogen hydride or derivative of nitrogen hydride, and thereafter a metal layer is formed by the CVD method using such mixed gas.

For the surface processing and growth of the contact metal layer in the present invention, the reducing effect of hydrazine is utilized. Namely, the clean surface can be formed by utilizing nitrogen hydride or organic nitrogen hydride such as hydrazine ($N_2H_4$) and methyl hydrazine ($CH_3N_2H_3$), keeping the substrate temperature in the range of 200° C.~800° C. by the heating method by resistance heating or the method using a halogen lamp or an arc lamp and by removing Si or metal impurity on the substrate surface, for example, Si oxide, metal oxide or organic substance through reduction thereof.

Since the nitrogen hydride or its derivative has strong reactivity, it reacts with metal halide, organic metal or metal complex, depositing metal nitride or pure metal on the substrate. Since side products include volatile nitrogen compounds or low order hydrocarbons, these are not incorporated by the deposited metal and thereby contact resistance is not increased.

In this CVD method, the growth condition may be set to the condition of a limited surface reaction, the thickness of the growth layer may be equalized, the growth layer may be deposited faithfully to the substrate surface including the stepped portions and a large coverage ratio may also be obtained. Moreover, in the present invention, a barrier metal layer is grown by the CVD method on the cleaned substrate surface without exposing the surface to the air and the contact metal layer is successively grown by the CVD method only by changing the reaction gas. Thereby, the respective CVDs are carried out on the cleaned substrate surface, both resistivity and reflectivity of contact metal layer are greatly improved in comparison with the existing one, and both coverage for contact hole and leakage current of p-n junctions are also much improved.

DESCRIPTION OF THE PREFERRED EMBODIMENTS

The embodiments of the present invention will be explained by referring to FIGS. 1 to 8. Like elements are designated by like numerals throughout the drawings.

First Embodiment

Figure 1:
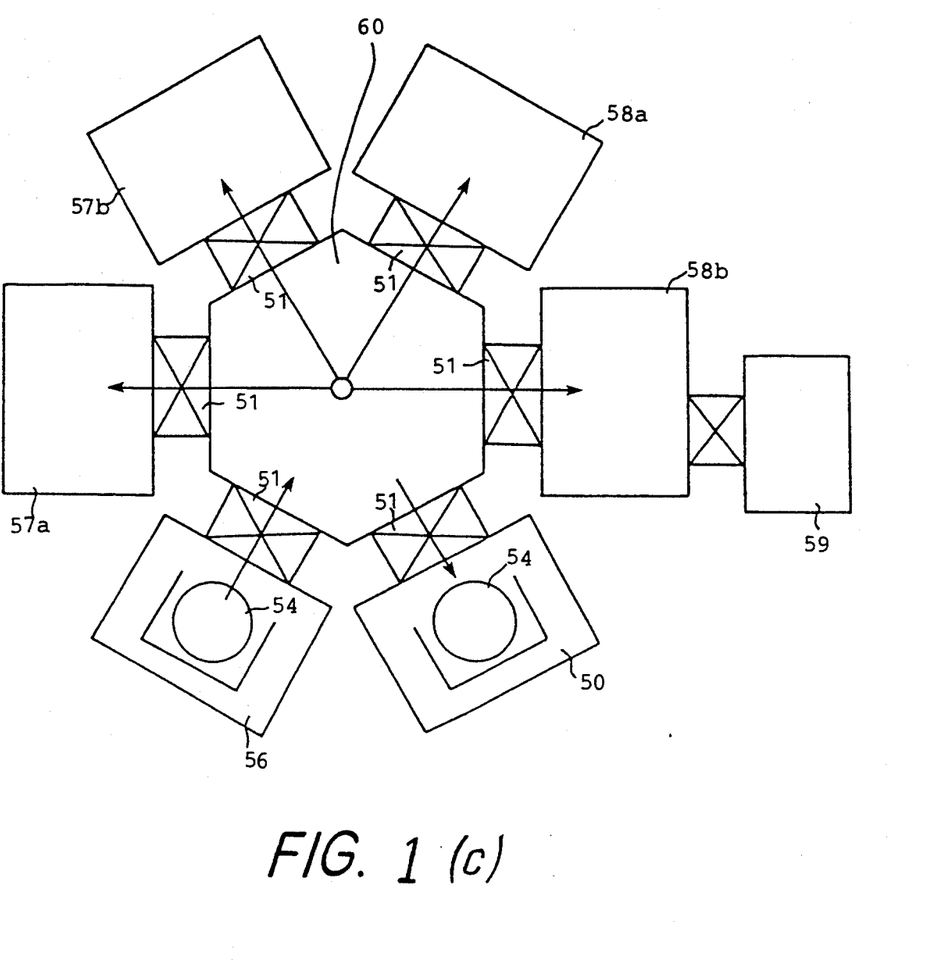
FIG. 1(a) is a diagram indicating a manufacturing apparatus used to form the contact regions in this embodiment.
FIG. 1(b) is a diagram indicating outline of a contact manufacturing apparatus coupling a substrate surface treatment chamber and two contact metal layer growth chambers.
FIG. 1(c) is a diagram indicating a contact manufacturing apparatus coupling two substrate surface treatment chambers, two contact metal layer growth chambers and two load lock chambers.
Figure 1A:
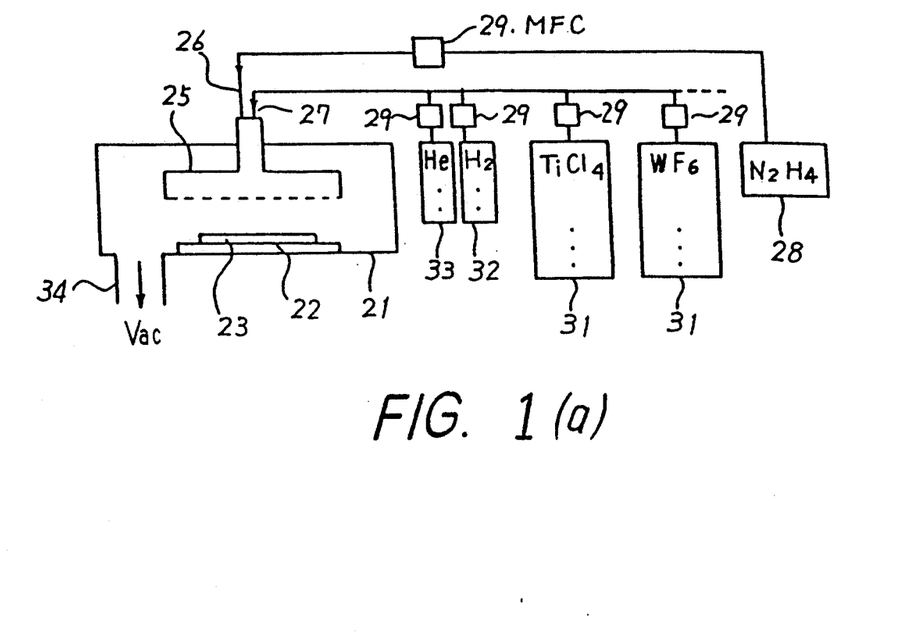

FIG. 1(a) is a diagram for explaining a manufacturing apparatus used for manufacturing a contact with this embodiment. In this figure, the reactant gas for substrate surface treatment and the reactant gas to form the contact metal layer are introduced respectively into the reaction chamber 21 through the gas shower 25 from the gas supply ports 26 and 27, and exhausted from the gas exhaust port 34. A substrate 23 to be surface treated is placed on a quartz window 22 provided in the lower side int he reaction chamber 21. At the lower side of quartz window 22, heater is provided (not illustrated) and thereby the substrate is controlled to the determined temperature.

The gas $N_2N_4$ 28 for substrate surface treatment is guided to the reaction chamber 21 from the gas supply port 26 through a mass flow controller 29. Since $N_2H_4$ 28 decomposes, when it is in a liquid or high concentration condition, through contact with the metal surface, it be desirable that $N_2H_4$ is prevented from direct contact with metal by conducting teflon processing to the piping for supplying the reactant gas.

The reactant gas 31 such as $TiCl_4$, $WF_6$ and carrier gas such as Ar gas 33, $H_2$ 32 to form a contact metal layer are guided to the reaction chamber 21 from the gas supply port 27 through the mass flow controller 29.

A gas pressure in the reaction chamber 21 is controlled to the predetermined value by adjusting the exhaustion speed from the exhaust port 34 by a vacuum pump and a flow rate of gas introduced through the gas supply ports 26, 27.

An apparatus shown in FIG. 1(a) corresponds to surface treatment of a substrate and growth of a contact metal layer in the same reaction chamber only through an exchange of gas.

Figure 1B:
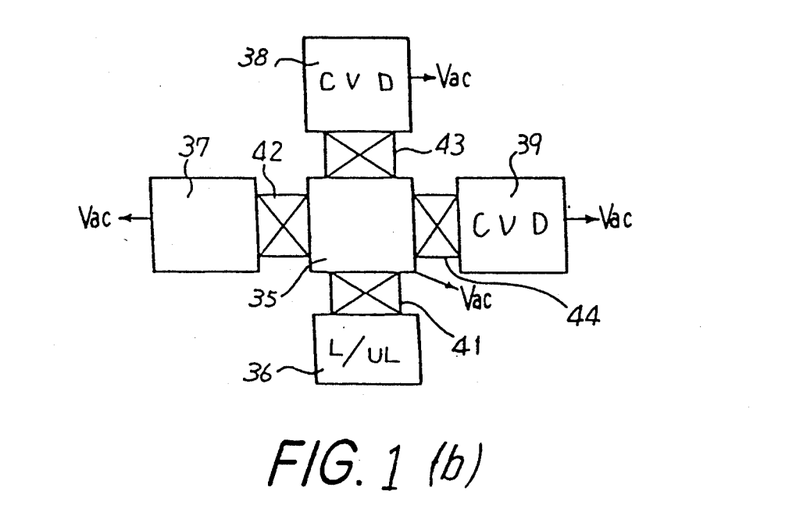

FIG. 1(b) is a diagram for explaining a manufacturing apparatus in which the substrate surface treatment and growth of a plurality of contact metal layers are carried out in different reaction chambers while the substrate is not exposed to the atmospheric condition.

FIG. 1(b), the load look chamber 35 is connected with the load/unload (L/UL) chamber 36, the surface processing chamber 37 and the CVD chambers 38, 39 similar to that in FIG. 1 through the gate valves 41, 42, 43, 44. The substrate to be processed is carried to any one of the surface treatment chamber 37 and CVD chamber 38 from the L/UL chamber 36 and is then carried out again from the L/UL chamber 36 after completion of the necessary processing. For example, the Si substrate surface is cleaned in the surface treatment chamber 37, the tungsten layer is grown in the CVD chamber 38 and the TiN layer is grown in the CVD chamber 39. Or, it si also possible that the TiN layer if formed first and the tungsten layer is then formed. During this process, the chambers 37, 38, 39 can be kept in the normal operating condition.

FIG. 1(c) is an apparatus larger in size than that shown in FIG. 1(b). As the one system path, a substrate 54 introduced from the inlet load lock chamber 56 is processed in the surface treatment chamber 57a through the valve 51 and central chamber 60, then moved to the growth chamber 58a through the central chamber 60 after surface treatment and is then taken out form the outlet load lock chamber 50 through the central chamber 60 after growth of the layer. Moreover, as the other system path, the substrate 54 introduced from the inlet load lock 56 is carried into the surface treatment chamber 57b through the valve 51 and central chamber 60. then moved to the growth chamber 58b through the central chamber 60 after the surface treatment, and is then taken out from the outlet load lock chamber 50 through the central chamber 60 after growth of layer. Each exhaust apparatus is represented by the exhaust apparatus 59.

The cleaning method for the substrate surface conducted by the manufacturing apparatus shown in FIG. 1(a) will be explained. Of course, it is possible to carry out the cleaning with the apparatus shown in FIG. 1(b) and FIG. 1(c).

Figure 3A:
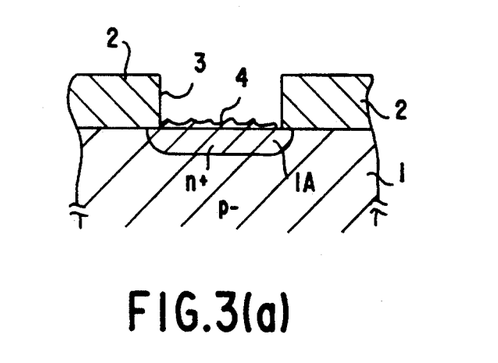
FIG. 3(a) is a schematic sectional view indicating the condition of the substrate to be carried into the manufacturing apparatus of FIG. 1 for surface treatment.

FIG. 3(a) shows the condition of substrate before it is carried into the manufacturing apparatus of FIG. 1(a) and it is thereafter called a sample. In this sample, a contact hole 3 is opened to the $SiO_2$ film 2 formed in the thickness of 5000 Å on the $p^-$ -Si substrate 1 and the shallow p-n junction is formed by forming the $n^{30}$ layer 1A on the substrate 1 by ion implantation of As. Such a sample is carried into the manufacturing apparatus of FIG. 1(a) and is then placed on a quartz window 22 provided at the lower side in the reaction chamber 21.

On the substrate exposed, there exists impurities 4 such as residual material of etching, intentionally deposited contaminants or natural oxides, etc. Therefore, the surface is cleaned by keeping the substrate temperature of 300° C. for 30 seconds. The typical condition of the reaction chamber is as follow. As the reactant gas $N_2H_4$ of 10 SCCM is used and as the carrier gas, any one of $H_2$, He or Ar of 10 SCCM is used, respectively. The pressure in the reaction chamber 21 is set to 0.1 Torr and the substrate temperature may be set within the range from 200° to 900° C. but the optimum temperature is 300° C.

Chemical reactions between $N_2H_4$ and the contaminant are as follows. In case the contaminant is $SiO_2$:

$$N_2H_4 + SiO_2 \rightarrow N_2 + 2H_2O + Si \tag{1}$$

or $$2N_2H_4 + SiO_2 \rightarrow 2N_2 + 2H_2O + SiH_4 \tag{2}$$

In case the contaminant is an organic substance:

$$N_2H_4 + C_nH_m \rightarrow N_2 + CH + H_2 \tag{3}$$

Figure 8A:
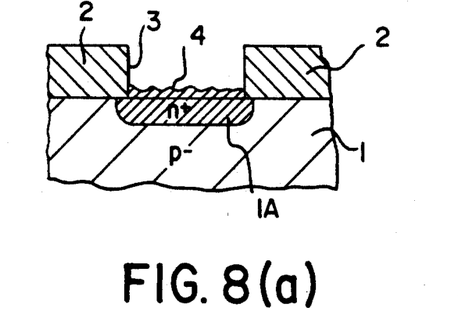
FIG. 8(a) is schematic sectional view of a sample before conducting the surface cleaning treatment to form the contact of the multilayer wirings.
Figure 8B:
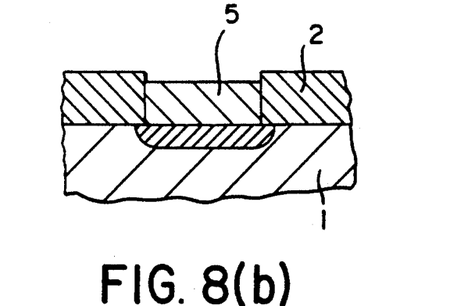
FIG. 8(b) is a schematic sectional view of a sample wherein the tungsten contact layer is formed in the contact hole after the surface cleaning treatment is carried out in the apparatus of FIG. 1.
Figure 8C:
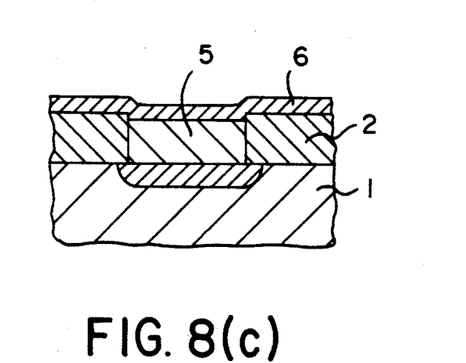
FIG. 8(c) is a schematic sectional view of a sample wherein the $TiN_2$ barrier metal layer is formed to the entire part of FIG. 8(b)
Figure 8D:
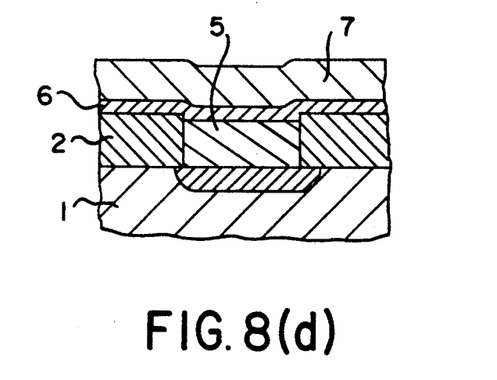
FIG. 8(d) is schematic sectional view of a sample wherein the tungsten layer is grown on the entire part of TiN layer of FIG. 8(c) and the tungsten wiring layer is formed by patterning the tungsten layer.
Figure 8E:
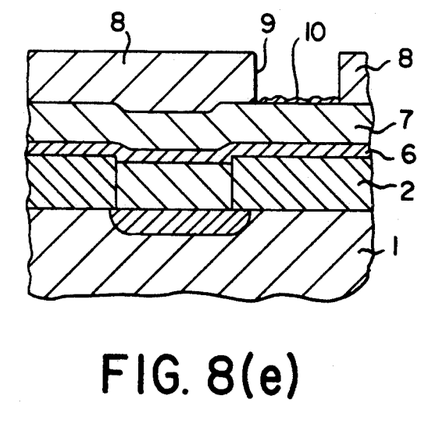
FIG. 8(e) is schematic sectional view of a sample wherein the contact hole is provided on the insulating interlayer formed covering the tungsten wiring 7.
Figure 8F:
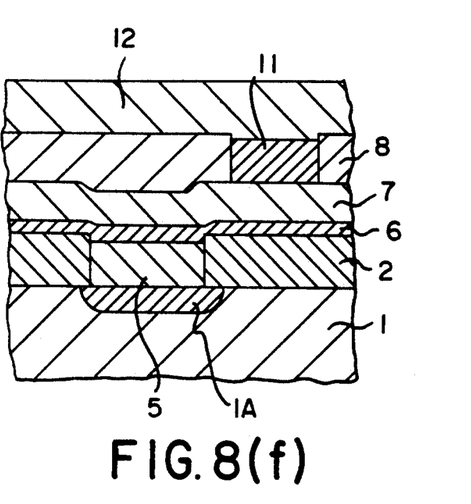
FIG. 8(f) is a schematic sectional view of a sample wherein the contact hole exposing substrate surface of FIG. 8(e) is cleaned, the tungsten layer is grown thereon and the aluminum layer for the second wiring layer is immediately formed on the entire part.

In case the contaminant is $Al_2O_3$ (when the base substrate is formed by Al, refer to FIG. 8(f)) in the fourth embodiment):

$$N_2H_4 + (2/3)Al_2O_3 \rightarrow N_2 + (4/3)Al + 2H_2O \tag{4}$$

Figure 2A:
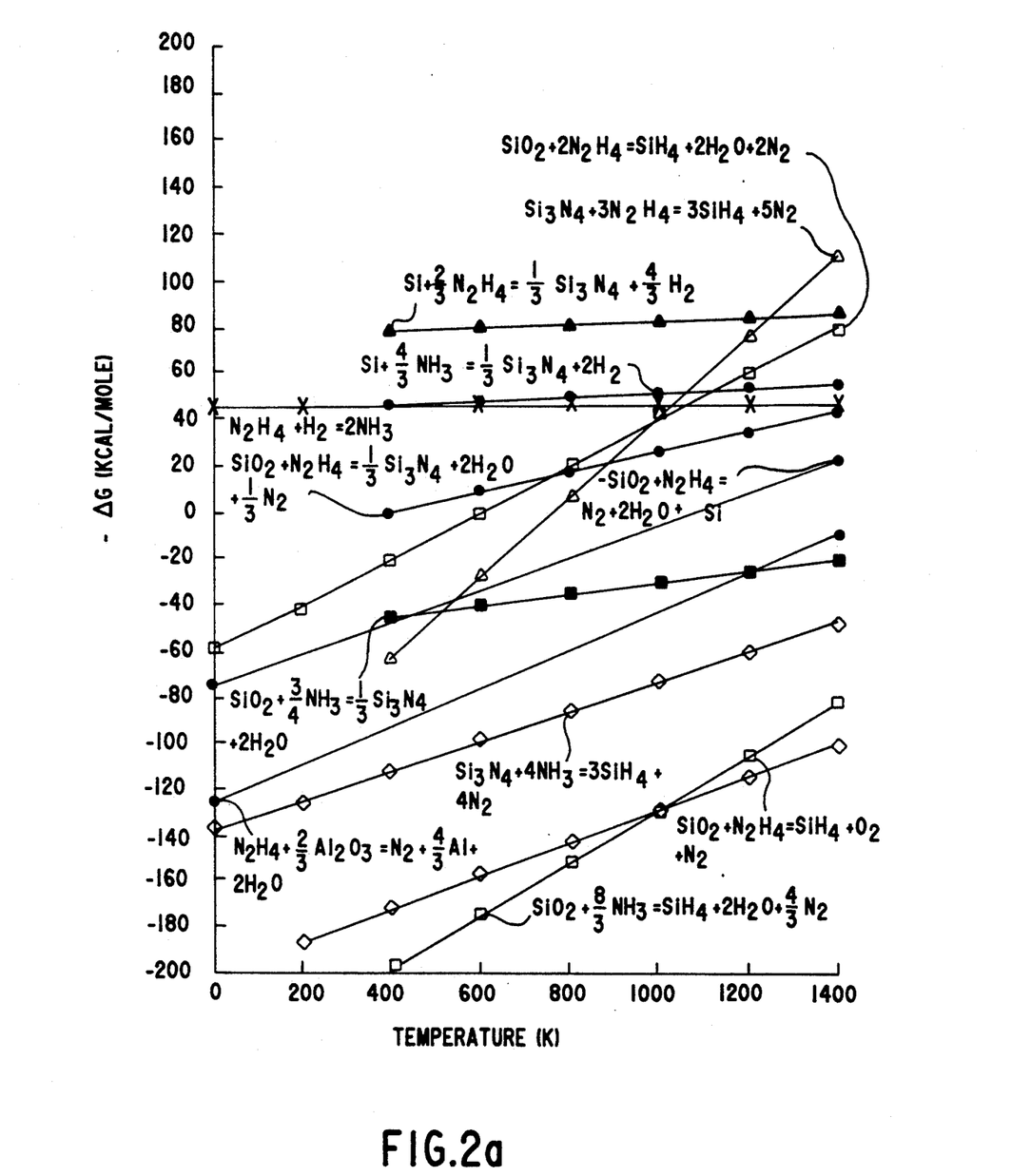
FIG. 2(a) is a diagram plotting produced free energy ($-\Delta G$) of related chemical reactions for absolute temperature(K)

The above reactant will be explained using FIG. 2(1). In FIG. 2(a), the generated free energy ($-\Delta G$) of the related reaction formula is plotted for absolute temperature (K). [Refer to Ref. 1) JANA Thermochemical Tables: (a) 2nd Ed. NSRDS-NBS-37 (1971), (b) 1974 Supplement, (c) 1975 Supplement.] in the reaction of formula (2), $-\Delta G$ becomes positive at the temperature higher than 600K and therefore the reaction proceeds in the direction of the arrow mark, In the reaction of formula (1), since $-\Delta G$ is negative at 1050K or less, when the reactions of formula (1) and (20 are concerted reactions, the reaction of (2) occurs preferentially. Namely, the Si substrate surface is cleaned. On the other hand, $$(2/3)N_2H_4 + Si \rightarrow (1/3)Si_3N_4 + (4/3)H_2 \quad (5)$$

The reaction of formula (5) can also be predicted but direct nitrogenation of Si does not even when $NH_3$ is used, if the temperature is lower than 1000° C. Moreover, since $-\Delta G$ becomes positive at 700K or higher in the reaction, $$Si_3N_4 + N_2H_4 \rightarrow N_2 + SiH_4 \quad (6)$$

the reaction (5) does not actually occur at 700K or higher, and therefore nitride is not generated. Namely, the Si substrate surface is cleaned.

In the case of formula (4), since $-\Delta G$ is negative in every temperature range, reaction seems to be difficult to occur. However, since an oxide at the surface does not have the thermally stable structure like $Al_2O_3$ but a natural oxide in weak coupling force such as $Al_xO_y$, following reaction occurs easily.

$$N_2H_4 + Al_xO_y \rightarrow N_2 + Al + H_2O$$

Next, the effect of surface cleaning process by $N_2H_2(CH_3)_2$ in FIG. 2(b) will be explained.

Figure 2B:
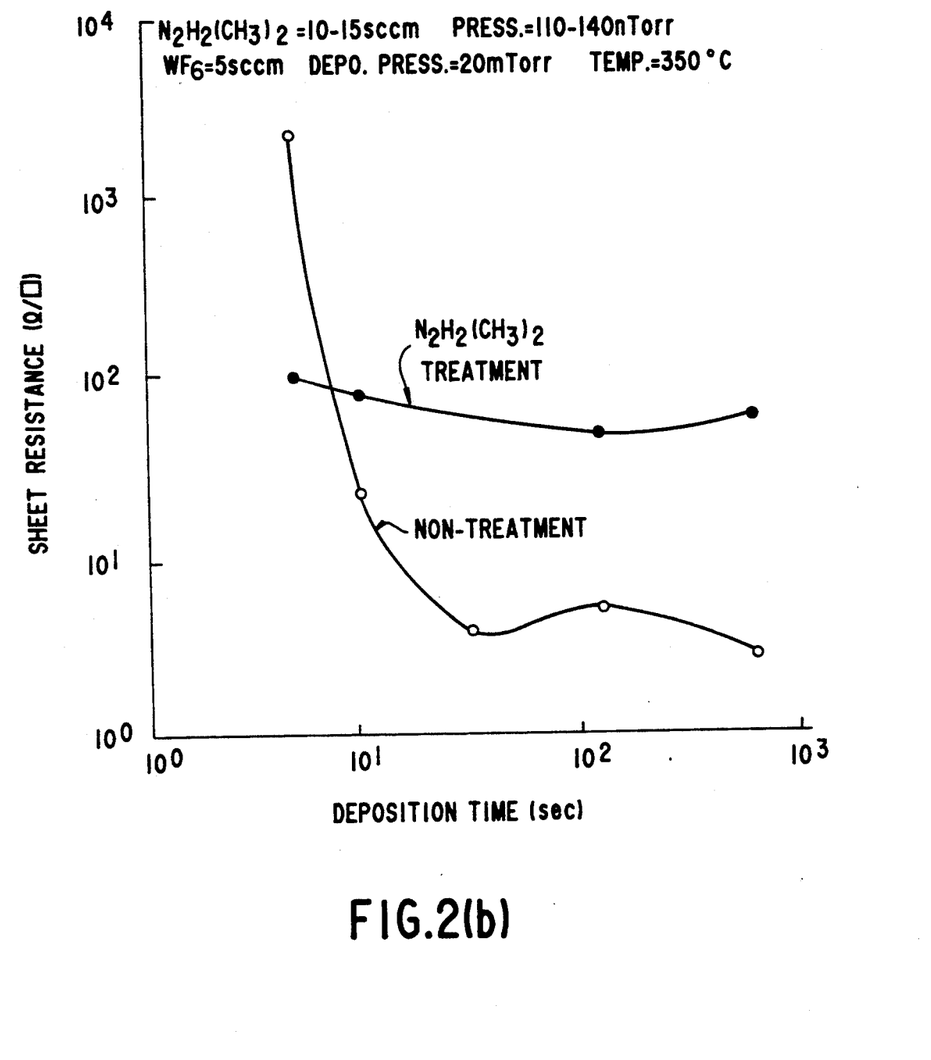
FIG. 2(b) is a diagram plotting, for the time of deposition in the $WF_6$ ambience, the value of sheet resistance of tungsten deposited on the substrate surface, after conducting surface treatment by $N_2H_2(CH_3)_2$; keeping the Si substrate to 350° C.

FIG. 2(b) plots the values of sheet resistance corresponding to film thickness of tungsten deposited at the substrate surface for the contact time to $WF_6$ ambience while the Si substrate is kept at 350° C., after the surface treatment by $N_2H_2(CH_3)_2$, the substrate is exposed to the $WF_6$ ambience without contact to the atmospheric ambience. In addition, for the comparison, the values of sheet resistance for the substrate which have not completed the surface treatment by $N_2H_2(CH_3)_2$ are also described. The substrate having completed the surface cleaning treatment by $N_2H_2(CH_3)_2$ shows a constant sheet resistance without relation to the time for contact with the $WF_6$ ambience, but the tungsten layer does not almost grow on the substrate which has not completed the surface treatment by $N_2H_2(CH_3)_2$ when the time for contact with the $WF_6$ ambience is only 5 seconds, namely the sheet resistance value thereof is equal to the value of the Si substrate and it becomes about 4 $\Omega/\square$ as the time becomes longer.

In general, the reducing reaction of formula (7) occurs between $WF_6$ and Si, $$WF_6 + (3/2)Si \rightarrow W + (3/2)SiF_4 \quad (7)$$

thereby, tungsten is deposited and to reaction completes when the disposed area of Si disappears. [For example, refer to Ref. 2) 'Tungsten and Other Refractory Metals for VLSI Applications' Vols. I–IV, Pittsburgh, Pa., (1986–1989).] It corresponds to a constant sheet resistance. Namely, the effect of surface cleaning treatment by $N_2H_2(CH_3)_2$ can be proved.

Meanwhile, when an oxide exists at the Si substrate surface, $WF_6$ invades into the Si substrate from the gap thereof and the film thickness of tungsten generated by the reaction of formula (7) becomes large. [Refer to Ref. 3) H. H. Busta and C. H. Tang; J. Electrochem. Soc., vol. 133, 1195 (1195 (1986); Ref. 4) T. Ohba, Y. Ohyama, S. Inoue and M. Maeda; Ref. 2) vol. II, 59 (1987).] Moreover, after the surface cleaning process through the reducing reaction by $H_2$, deposition of tungsten by $WF_6$ has been measured in terms of the sheet resistance for comparison. The result ranges from 30 to 80 $\Omega/\square$ and this value becomes almost equal to that obtained by the surface cleaning process by $N_2H_2(CH_3)_2$. However, in the surface cleaning treatment through the reducing reaction by $H_2$, the substrate temperature is set to 700° C. and it is high in comparison with the substrate temperature of 350° C. in the case of the surface cleaning treatment by $N_2H_2(CH_3)_2$.

As described previously, the contaminant of the substrate surface is reduced by $N_2H_4$ and can be eliminated from the surface. This condition is shown in FIG. 3(b).

Second Embodiment

Figure 3B:
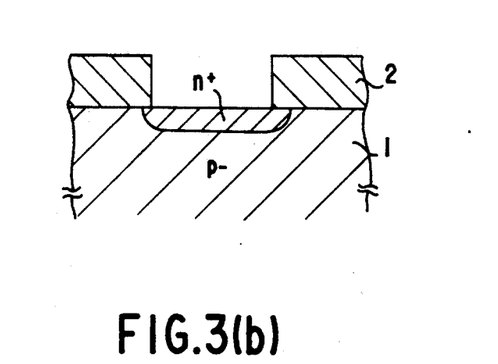
FIG. 3(b) is a schematic sectional view indicating the condition that contaminants at the substrate surface are reduced and eliminated by $N_2H_4$.
Figure 4A:
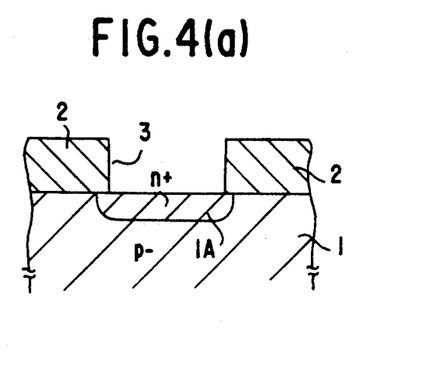
FIG. 4(a) is a schematic sectional view of substrate having completed the surface cleaning treatment.

In the apparatus of FIG. 1(a), a contact metal layer is formed on the sample shown in FIG. 4(a) having completed the surface cleaning treatment to the substrate 1 as shown in FIG. 3(b) and the effect of the surface cleaning treatment is proved by comparing the contact characteristic with that obtained by the prior art.

Figure 4B:
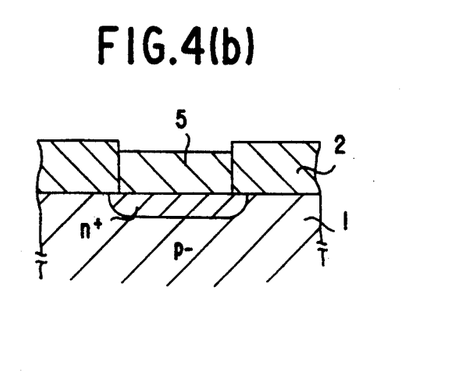
FIG. 4(b) is a schematic sectional view of a sample wherein a tungsten layer is formed by the CVD method within the contact hole of FIG. 4(a)

As shown in FIG. 4(b), the tungsten layer 5 is selectively grown by the CVD method using $WF_6$ in the thickness of 4000 Å within the contact hole 3. The typical condition for growth of tungsten is as follows.

The flow rates of $N_2H_4$ and $WF_6$ as the reaction gases are respectively set to 10 SCCM, 15 SCCM, and the flow rate of $H_2$ as the carrier gas is set to 50 SCCM. The pressure in the reaction chamber 21 is set to 0.1 Torr, while the substrate temperature to 300° C.

Chemical reactions in relation to growth of tungsten are as follow.

$$(3/2)N_2H_4 + WF_6 \rightarrow (3/2)N_2 + HF + W$$
$$(-\Delta G = 109.35 \text{ kcal/mol at } 600K) \quad (8)$$

Figure 4C:
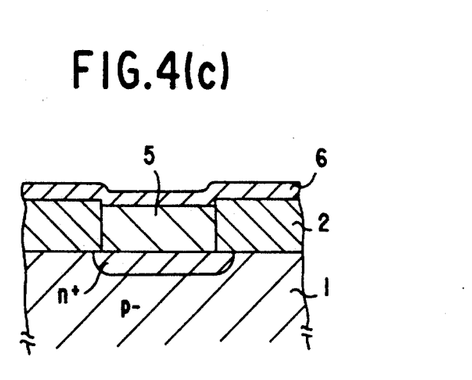
FIG. 4(c) is a schematic sectional view of a sample wherein a TiN layer is formed to the entire surface of FIG. 4(b)

Next, as shown in FIG. 4(c), supply of $WF_6$ is changed to $TiCl_4$ and the TiN layer (or Ti layer) 6 is formed in the thickness of 500 Å as the adhesion layer to the entire surface of FIG. 4(b). Growth of the TiN layer is carried out under the following conditions. As the reactant gas, flow rates of $TiCl_4$ and $N_2H_4$ are set to 10 SCCM and that of carrier gas $H_2$ is set to 100 SCCM. The pressure in the reaction chamber is set to 0.2 Torr. The substrate temperature is set in the range from 400° C. to 800° C. but desirably set in the range from 500° C. to 700° C. At the substrate temperature of 600° C., the following chemical reaction occurs.

$$N_2H_4 + TiCl_4 \rightarrow TiN + (1/2)N_2 + 4HCl(-\Delta G = 70.3\text{-}$$
$$Kcal/mol \text{ at } 900K) \quad (9)$$

For instance, when the substrate temperature is 500° C. or less.

$$N_2H_4 + TiCl_4 \rightarrow TiN + (1/2)N_2 + 4HCl(-\Delta G = 70.3\text{-}$$
$$Kcal/mol \text{ at } 500K) \quad (10)$$

Figure 4D:
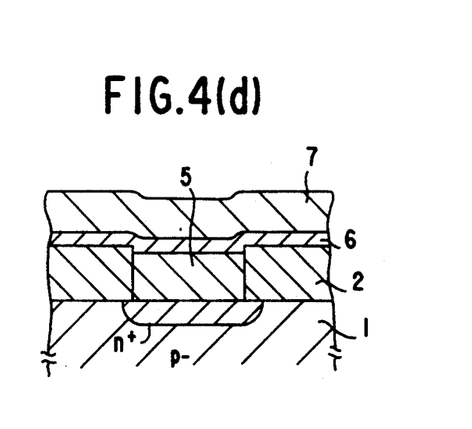
FIG. 4(d) is a schematic sectional view of a sample wherein a tungsten layer is grown on the entire surface of the TiN layer of FIG. 4(c) and the tungsten wiring layer is formed by patterning the tungsten layer.

Next, as shown in FIG. 4(d), supply of $TiCl_4$ is changed again to $WF_6$, the tungsten layer is grown in the thickness of 3000 Å on the entire surface of TiN layer 6 under the same condition as the case where the tungsten layer 5 is grown, and the tungsten wiring layer 7 is formed by patterning the tungsten layer.

Next, quality evaluation of this contact will be explained hereunder.

Figure 5A:
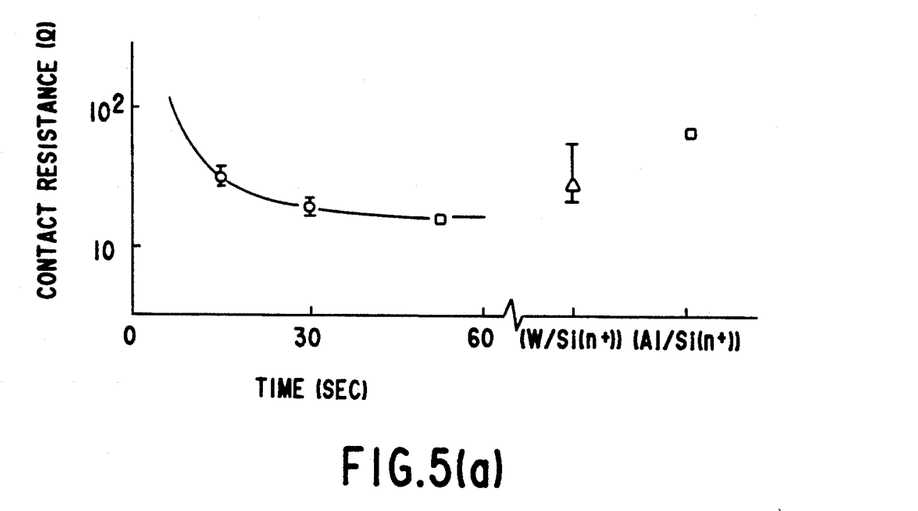
FIG. 5(a) is a graph indicating the relationship between contact resistance (R) per 1 $\mu m \times 1$ 082 m and the surface cleaning treatment time int he contact W/Si(n+)

In the contact W/Si(n+) forming the tungsten layer on the n-type Si shown in FIG. 5(a), the relationship between the contact resistance (R) per 1 $\mu m \times 1$ $\mu m$ and the surface cleaning treatment time is indicated. In FIG. 5(a), for the purpose of comparison, the contact resistance values in case the surface treatment are carried out for 10 to 20 seconds with diluted solution of hydrogen fluoride (HF) of 1% to the same contact W/Si(n+) and the contact resistance values in case the surface cleaning treatment is carried out to a different kind of contact A l/Si(n+) are indicated together. As seen in FIG. 5(a), the contact resistance value becomes smaller when the surface cleaning treatment becomes longer and the minimum contact resistance value can be obtained by the method of the present invention wherein the surface treatment time is 30 seconds or longer.

Figure 5B:
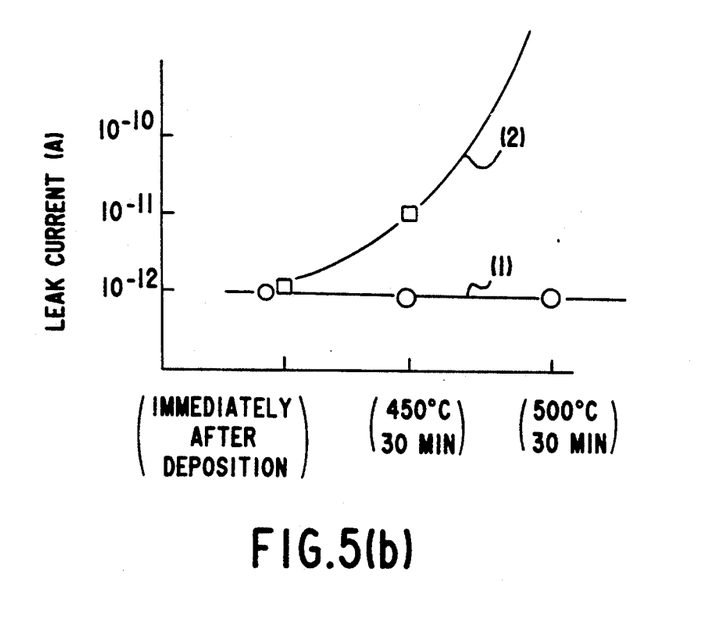
FIG. 5(b) is a graph indicating the relationship between leakage current of a diode and annealing int he contact W/Si)$n^{30}$) of FIG. 5(a)

FIG. 5(b) indicates a relationship between a leak current of diode and annealing for the embodiment W/Si(n+) of FIG. 5(a) and the contact Al/Si(n+).

The leak current of W/Si(n+) contact immediately after formation of the tungsten layer on the surface treated by $N_2H_4$, after annealing at 450° C. for 30 minutes and after annealing at 500° C. for 30 minutes is indicated by curve (1), respectively. Moreover, for the A l/Si(n+) contact, the leak currents obtained immediately after growth of A l, the annealing at 450° C. for 30 minutes and at 500° C. for 30 minutes after carrying out the surface cleaning using HF are indicated by curve (2). As will be understood from FIG. 5, a leak current of the W/Si(n+) contact in this embodiment is smaller than that of the existing A l/Si(n+) and is also smaller than that obtained by annealing at 450° C. or higher by the order of one digit or more.

Third Embodiment

Figure 6A:
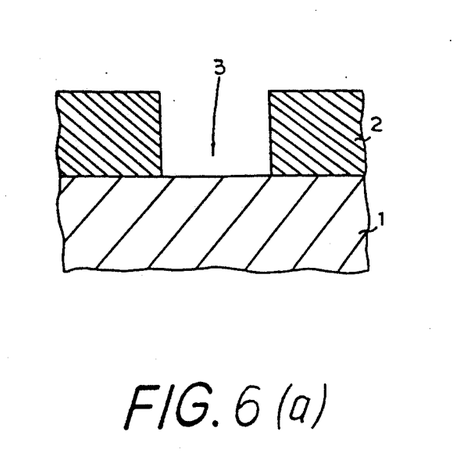
FIG. 6(a) is a schematic sectional view of a sample having completed the substrate surface cleaning treatment.

FIG. 6(a) indicates a sample wherein an insulating interlayer film 2 is formed by depositing PSG (phosphosilicate glass) in the thickness of about 5000 Å on the silicon substrate 1, for example, by the CVD method, thereafter a contact hole 3 is formed in the width of 5000 Å through selective etching of the insulating interlayer film 2, for example, by RIE (reactive ion etching) and the cleaning process is carried out for the surface of substrate 1 as shown in FIG. 3(b) within the apparatus of FIG. 1(a). The other method for forming the tungsten contact layer to the sample shown in FIG. 6(a) in the apparatus of FIG. 1(a).

Figure 6B:
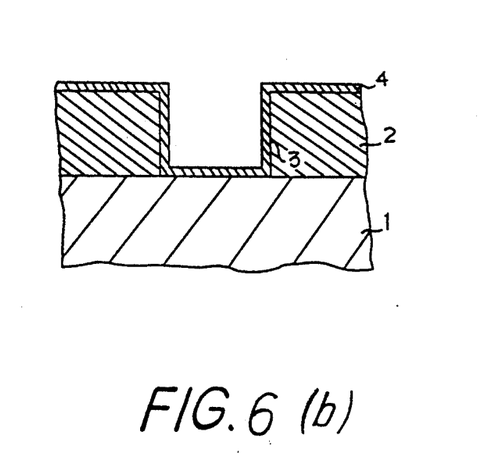
FIG. 6(b) is a schematic sectional view of a sample wherein the $TiN_2$ barrier metal layer is formed on the contact hole and interlayer insulation film of FIG. 6(a)

As shown in FIG. 6(b), a TiN barrier metal layer 4 is formed in the thickness of about 500 Å on the contact hole 3 and interlayer insulating film 2. The TiN barrier metal layer 4 is formed by the CVD method not by the sputtering method like the prior art. The typical condition of CVD is as follow.

As the reaction gas, $TiCl_4$ is introduced 5 SCCM and $N_2H_4$ in 20 SCCM, while as the carrier gas, $H_2$ is introduced in 50 SCCM, respectively to the reaction chamber together, the pressure is set to 0.1 to 1.0 Torr and substrate temperature is kept at 600° C.

Figure 6C:
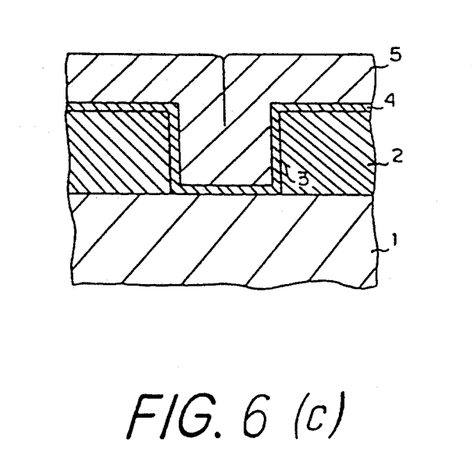
FIG. 6(c) is a schematic sectional view of a sample wherein a tungsten contact layer is formed on the $TiN_2$ barrier metal layer of FIG. 6(a)

Next, as shown in FIG. 6(c), a tungsten contact layer 5 is formed in the thickness of about 5000 Å on the TiN barrier metal layer 4. This is carried out in the same reaction chamber by exchanging the reactant gas and carrier gas. The typical condition of CVD is as follow. As the reaction gas, $WF_6$ is introduced in 10 SCCM and $N_2H_4$ in 10 SCCM, while as the carrier gas, H is introduced in 100 SCCM, respectively to the reaction chamber together, the pressure is set to 0.1 to 10 Torr and substrate temperature is kept at 380° C.

Figure 6D:
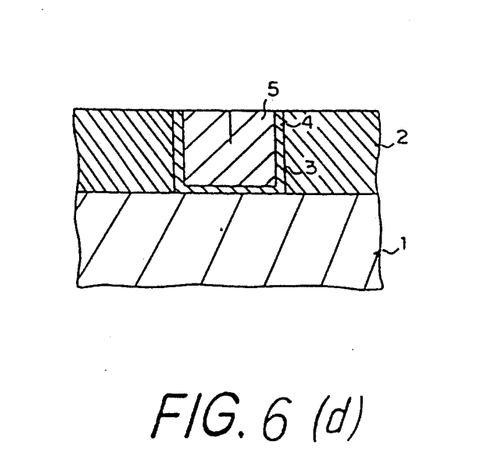
FIG. 6(d) is a schematic sectional view of a sample wherein the $TiN_2$ barrier metal layer and tungsten contact layer are buried in the contact hole.

Finally, the sample is taken out from the apparatus of FIG. 1(a) and the wiring structure as shown in FIG. 6(d) burying the TiN barrier metal layer 4 and tungsten contact layer 5 can be obtained in the contact hole 3 by etching the tungsten contact layer 5 and TiN barrier metal layer 4 using, for example, the RIE (reactive ion etching) method.

Since the contact layer is formed by the CVD method, unlike the conventional sputtering method, in order to form the wiring structure indicated in this embodiment, the TiN barrier metal layer 4 is more dense than the existing layer and coverage to the contact hole 3 is also good. This is also true for the tungsten contact layer 5. Moreover, since the reactive side products are not incorporated into the metal layer, the relevant layer has a low specific resistance.

Figure 7A:
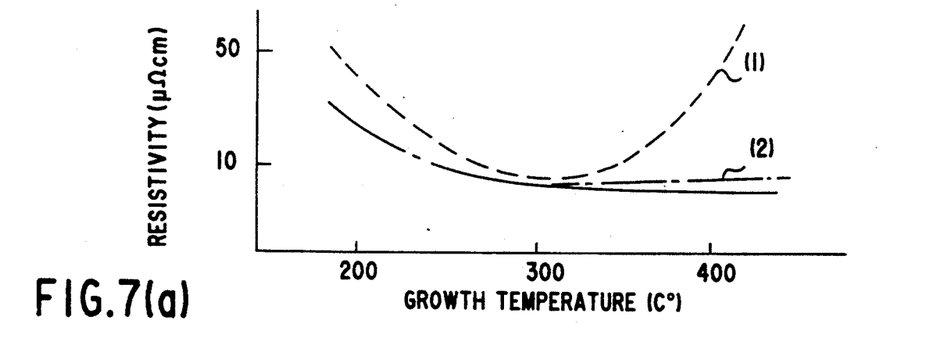
FIG. 7(a) is a graph plotting resistivity of the tungsten contact layer for growth temperature (substrate temperature) of the CVD method.
Figure 7B:
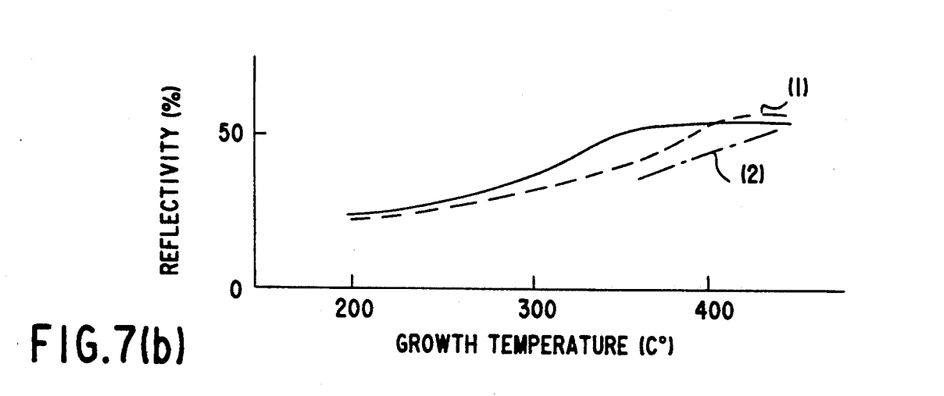
FIG. 7(b) is a graph plotting reflectivity of the tungsten contact layer for growth temperature (substrate temperature) of the CVD method.

FIGS. 7(a), 7(b) are graphs for evaluating the tungsten layer 5 manufactured by the steps shown in FIG. 6. FIG. 7(a) is a graph plotting the specific resistance of the tungsten layer 5, while FIG. 7(b) is a graph plotting reflectivity of tungsten layer 5 to Al, respectively for the growth temperature (substrate temperature) of CVD. The graphs indicated by solid lines correspond to the layers manufactured by the steps of FIG. 6, while the graphs indicated by broken lines (1) correspond to the tungsten contact layer manufactured by the conventional reducing reaction of $SiH_4$ and the graphs indicated by chain lines (2) correspond to the tungsten layer manufactured by the conventional reducing reaction of $H_2$. (The CVD growth condition through the reducing reaction by $SiH_4$ is that the mixed gas including $WF_6$ of 5 SCCM, $SiH_4$ of 5 SCCM and $H_2$ of 100 SCCM is used under the pressure of 0.1 Torr. The CVD growth condition through the reducing reaction by $H_2$ is that the mixed gas including $WF_6$ of 10 SCCM and $H_2$ of 1000 SCCM is used under the pressure of 5 Torr.)

As can be understood from FIGS. 7(a), 7(b), the tungsten layer having small resistivity and large reflectivity simultaneously cannot be obtained in the prior art. However, in the present invention, when the growth temperature is about 350° C. to 450° C., the tungsten layer formed has a smaller resistivity value and simultaneously larger reflectivity than that of the prior art.

Figure 7C:
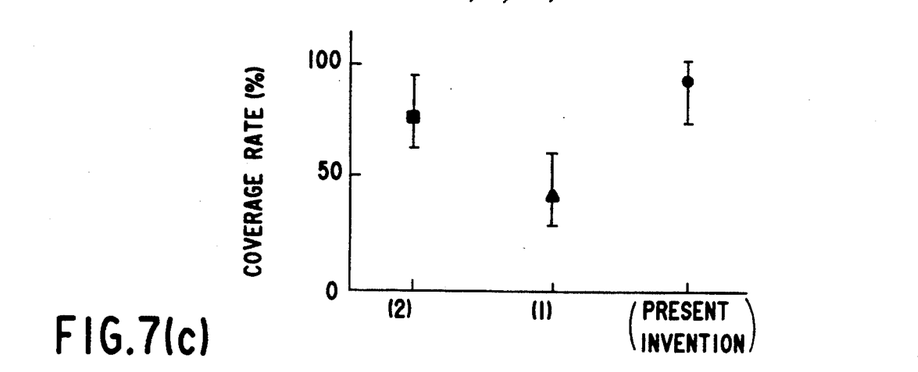
FIGS. 7(c)–7(d) are diagrams comparing the coverage ratio of the contact hole in the tungsten contact layer manufacturing method with that of the prior art.
Figure 7D:
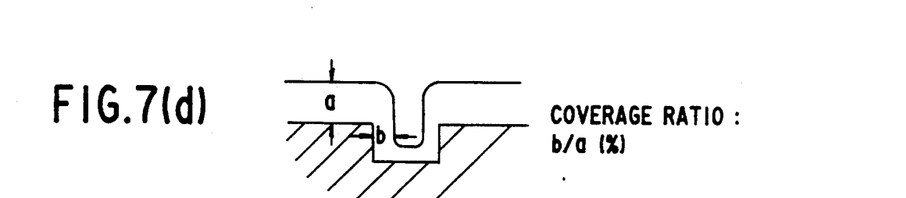

FIG. 7(c) compares the coverage ratio of contact hole formed by the tungsten layer manufacturing method by the present invention with that of the prior art. The prior art methods (1), (2) are same as those in FIG. 7(a), 7(b). The coverage ratio is expressed, as illustrated in the upper part of FIG. 7(c), by the percentage of the ratio of the thickness on the side wall of contact hole and the thickness on the substrate. The coverage ratio by the method of the present invention is larger than that of the prior art. The coverage ratio can further be improved by lowering the flow rate of $N_2H_4$ against $WF_6$, for example $WF_6/N_2H_4 = 10/2$.

In the method of this third embodiment, the tungsten layer is formed on the TiN barrier layer but the Cu layer can be formed on the TiN barrier layer. In this case, the Cu layer may be formed by using the Cu halide such as $WF_6$ used for formation of the tungsten layer as the reaction gas or the metal complex gas such as Cu(H-FA)$_2$.

Fourth Embodiment

Next, an example of formation of of contact with multilayer wiring manufactured by the apparatus of FIGS. 1(a), 1(b) or 1(c) will be explained.

In FIG. 8(a) to FIG. 8(d), the processes to form the contact with the multilayer wirings are explained with the schematic sectional views.

FIG. 8(a) to FIG. 8(d) indicate the same series of processes as that from FIG. 3(a) to FIG. 3(b) and then from FIG. 4(a) to FIG. 4(d).

When the process shown in FIG. 8(d) is completed, this sample is taken out from the manufacturing apparatus of FIGS. 1(a), 1(b) or 1(c).

Next, as shown in FIG. 8(e), the $SiO_2$ film 8 is formed in the thickness of 4000 Å as the insulating interlayer layer covering the tungsten wiring 7 and a contact hole 9 is then opened thereto. The sample is then sent to the reaction chamber of the manufacturing apparatus of FIG. 1(a), 1(b) or 1(c) and the surface treatment such as that conducted in FIG. 3(a) is conducted for 30 seconds to 60 seconds. Thereby, impurity or oxide 10 adhered to or remaining on the tungsten wiring 7 in the contact hole 9 can be eliminated.

Finally, as shown in FIG. 8(f), the tungsten layer 11 is grown in the thickness of about 4000 Å in the contact hole 9 by the method similar to that in FIG. 3(b). Thereafter, the reaction gas $WF_6$ is immediately changed, for example, to $AlCl_3$ and the Al layer 12 as second layer wiring is grown onto the entire surface. For the formation of Al layer, Al $(CH_3)_3$ or Al $(iC_4H_9)_3$ may be used in place of $AlCl_3$.

As explained heretofore, the one contact with multilayer wirings can be formed.

In the above embodiment, $WF_6$, $TiCl_4$ are used as the metal halide gas, but moreover a halogenide of molybdenum(Mo), vanadium(V), zirconium(Zr), gold(Au), copper(Cu), and platinum(Pt) may also be used. In addition, as the organic metal or metal complex, tungsten carbonyl($W(Co)_6$), copper hexafluoroacetylacetone($Cu(HFA)_2$), gold hexafluoroacetylacetone($Au(HFA)$) and other complex including Ti or Zr can also be used.

Moreover, as the nitrogen hydride, $N_2H_4$ mainly used but $N_2H_2$, $N_5H_5$ can also be used. As the derivatives of nitrogen hydride in the present invention, $N_2H(CH_3)_3$, $N_2H_2(CH_3)_2$, $N_2H_3(CH_3)$ and $N_5H_4(CH_3)$ can also be used.

What is claimed is:

1. A method of forming a conducting layer on a semiconductor substrate comprising the steps of:
    providing a patterned insulating layer having at least one of an exposed surface region of a conducting layer and an exposed surface region of a semiconductor layer;
    cleaning said exposed surface region of said substrate being heated to a pre-defined temperature, by a mixed gas containing a gas selected from a group consisting of nitrogen hydride and nitrogen hydride derivatives for etching oxide; and
    forming a conducting layer containing a metal on said heated substrate successively after said cleaning step without exposing said substrate to atmospheric conditions, using a mixed gas of a gas selected from a group consisting of nitrogen hydride and nitrogen hydride derivative, and a gas containing metal compounds, wherein said gas containing metal compound is metal complex.

2. A method of forming a conducting layer on a semiconductor substrate comprising the steps of:
    providing a patterned insulating layer having at least one of an exposed surface region of a conducting layer and an exposed surface region of a semiconductor layer;
    cleaning said exposed surface region of said substrate being heated to a pre-defined temperature, by a mixed gas containing a gas selected from a group consisting of nitrogen hydride and nitrogen hydride derivative for etching oxide; and
    forming a conducting layer containing a metal on said heated substrate successively after said cleaning step without exposing said substrate to atmospheric conditions, using a mixed gas of a gas selected from a group consisting of nitrogen hydride and nitrogen hydride derivative, and a gas containing metal compounds, wherein said gas containing metal compound is metal complex selected from a group consisting of tungsten carbonyl($W(Co)_6$), copper hexafluoroacetylacetone($Cu(HFA)_2$), gold hexafluoroacetylacetone ($Au(HFA)$) and complexes of Ti and Zr.

3. A method of forming a conducting layer semiconductor substrate comprising the steps of:
    providing a patterned insulating layer having at least one of an exposed surface region of a conducting layer and an exposed surface of a semiconductor layer;
    cleaning said exposed surface region of said substrate being heated to definite temperature, by a mixed gas containing a gas selected from a group consisting of nitrogen hydride and nitrogen hydride derivative for etching oxide;
    forming a first conducting layer containing a metal on said heated substrate successively after cleaning said exposed surface region without exposing said substrate to atmospheric conditions, using a mixed gas of a gas selected from a group consisting of nitrogen hydride and nitrogen hydride derivative, and a gas containing metal compounds; and
    forming a second conducting layer containing a metal on said first conducting layer without exposing said first conducting layer to atmospheric condition, using a mixed gas selected from a group consisting of nitrogen hydride and nitrogen hydride derivative, and a gas containing metal compounds.

4. A method according to claim 3, wherein said first conducting layer contains nitrogen.

5. A method according to claim 3, wherein said cleaning step, said step of forming said first conducting layer and said step of forming said second conducting layer are performed in a same gas chamber.

6. A method according to claim 3, wherein said cleaning step, said step of forming said first conducting layer and said step of forming said second conducting layer are performed successively in different gas chambers connected through connecting chamber.

7. A method of forming a conducting layer semiconductor substrate comprising the steps of:
    providing a patterned insulating layer having at least one of an exposed surface region of a conducting layer and an exposed surface of a semiconductor layer;
    cleaning said exposed surface region of said substrate being heated to definite temperature, by a mixed gas containing a gas selected from a group consisting of nitrogen hydride and nitrogen hydride derivative for etching oxide;
    forming a first conducting layer containing a metal on said exposed on said heated substrate successively after cleaning said surface region without exposing said substrate to atmospheric conditions, using a mixed gas of a gas selected from a group consisting of nitrogen hydride and nitrogen hydride derivative, and a gas containing metal compounds; and forming a second conducting layer containing a metal on said first conducting layer without exposing said first conducting layer to atmospheric condition, using a mixed gas selected from a group consisting of nitrogen hydride and nitrogen hydride derivative, and a gas containing metal compounds, wherein the gas containing the metal compounds is a metal complex.

8. A method of forming a conducting layer semiconductor substrate comprising the steps of:

providing a patterned insulating layer having at least one of an exposed surface region of a conducting layer and an exposed surface of a semiconductor layer;

cleaning said exposed surface region of said substrate being heated to definite temperature, by a mixed gas containing a gas selected from a group consisting of nitrogen hydride and nitrogen hydride derivative for etching oxide;

forming a first conducting layer containing a metal on said exposed on said heated substrate successively after cleaning said surface region without exposing said substrate to atmospheric conditions, using a mixed gas of a gas selected from a group consisting of nitrogen hydride and nitrogen hydride derivative, and a gas containing metal compounds; and forming a second conducting layer containing a metal on said first conducting layer without exposing said first conducting layer to atmospheric condition, using a mixed gas selected from a group consisting of nitrogen hydride and nitrogen hydride derivative, and a gas containing metal compounds, wherein the gas containing the metal compounds is a metal complex selected from a group consisting of tungsten carbonyl (W(Co)$_6$), copper hexafluoroacetylacetone (Cu(HFA)$_2$), gold hexafluoroacetylacetone (Au(HFA)) and complexes of Ti and Zr.

9. A method according to claim 5 or 6, wherein said semiconductor substrate is a silicon substrate, said method further comprising the steps of:

(a) cleaning an exposed surface region of said silicon substrate at a bottom of a contact hole formed in a silicon dioxide film on said silicon substrate, said silicon substrate is heated at a temperature between 200° C. and 900° C. using a mixed gas of hydrazine and hydrogen;

(b) forming a W layer on said exposed surface region of said silicon substrate at the bottom of said contact hole at a temperature between 200° C. and 400° C. by CVD (chemical vapor deposition), using a mixed gas of WF$_6$, a N$_2$H$_4$ and H$_2$;

(c) forming a TiN layer on said W layer at a temperature between 400° C. and 800° C. by CVD using a mixed gas of Ticl$_4$;

(d) patterning W layer in atmospheric condition, said W layer formed on said TiN layer under a same condition as step (b);

(e) cleaning an exposed surface region of a W layer at the bottom of a contact hole formed in the silicon dioxide film on said W layer under a same condition as step (a); and (f) forming a W layer on said exposed surface region at the bottom of said contact hole under a same condition as step (b).

10. A method according to claim 9, wherein during said step of cleaning the exposed surface region of said silicon substrate, said silicon substrate is heated at a temperature between 300° C. and 600° C.

11. A method according to claim 9, wherein said step of forming a TiN layer on said W layer is performed at a temperature between 500° C. and 700° C.

* * * * *